United States Patent
Hwang et al.

(10) Patent No.: US 7,790,587 B2
(45) Date of Patent: Sep. 7, 2010

(54) METHOD TO REDUCE JUNCTION LEAKAGE THROUGH PARTIAL REGROWTH WITH ULTRAFAST ANNEAL AND STRUCTURES FORMED THEREBY

(75) Inventors: Jack Hwang, Portland, OR (US); Sridhar Govindaraju, Hillsboro, OR (US); Seok-Hee Lee, Portland, OR (US); Patrick H. Keys, Portland, OR (US); Chad D. Lindfors, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 656 days.

(21) Appl. No.: 11/594,301

(22) Filed: Nov. 7, 2006

(65) Prior Publication Data

US 2008/0121882 A1    May 29, 2008

(51) Int. Cl.
*H01L 21/423* (2006.01)
(52) U.S. Cl. .............................. 438/530; 257/E21.454

(58) Field of Classification Search ................. 438/530; 257/E21.454
See application file for complete search history.

(56) References Cited

U.S. PATENT DOCUMENTS

| | | | | |
|---|---|---|---|---|
| 6,936,505 | B2 * | 8/2005 | Keys et al. | 438/166 |
| 7,118,980 | B2 * | 10/2006 | Jain | 438/305 |
| 2005/0233506 | A1 * | 10/2005 | Horch et al. | 438/134 |
| 2006/0183302 | A1 * | 8/2006 | Kohli | 438/486 |
| 2008/0057636 | A1 * | 3/2008 | Lindsay et al. | 438/199 |

* cited by examiner

*Primary Examiner*—Jerome Jackson, Jr.
*Assistant Examiner*—Paul A Budd
(74) *Attorney, Agent, or Firm*—Kathy J. Ortiz

(57) ABSTRACT

Methods and associated structures of forming a microelectronic device are described. Those methods may include creating an amorphous region in source/drain regions of a substrate by ion implantation with an electrically neutral dopant, annealing with a first anneal that removes defects without completely re-crystallizing the amophous region, ion implantation of electrically active dopant to a depth shallower than the remaining amorphous region, followed by a second anneal.

8 Claims, 8 Drawing Sheets

METHOD TO REDUCE JUNCTION LEAKAGE THROUGH PARTIAL REGROWTH WITH ULTRAFAST ANNEAL AND STRUCTURES FORMED THEREBY

BACK GROUND OF THE INVENTION

One concern with the process of forming a microelectronic device, such as a device utilizing transistors, for example, involves the step of adding electrically active dopants to the junctions. One method of adding dopants involves the ion implantation of such dopant ions into the surface of a material, such as a semiconductor material, for example. After ion implantation, the dopants may be annealed at a high temperature to remove defects that may be present in the material and to place the dopants into substitutional lattice sites. In some cases, the ion implanted region may be damaged enough to convert the lattice into an amorphous layer. The manner in which the amorphous layer may be re-grown (i.e., re-crystallized) can have a large impact on the final electrical characteristics of the transistor.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
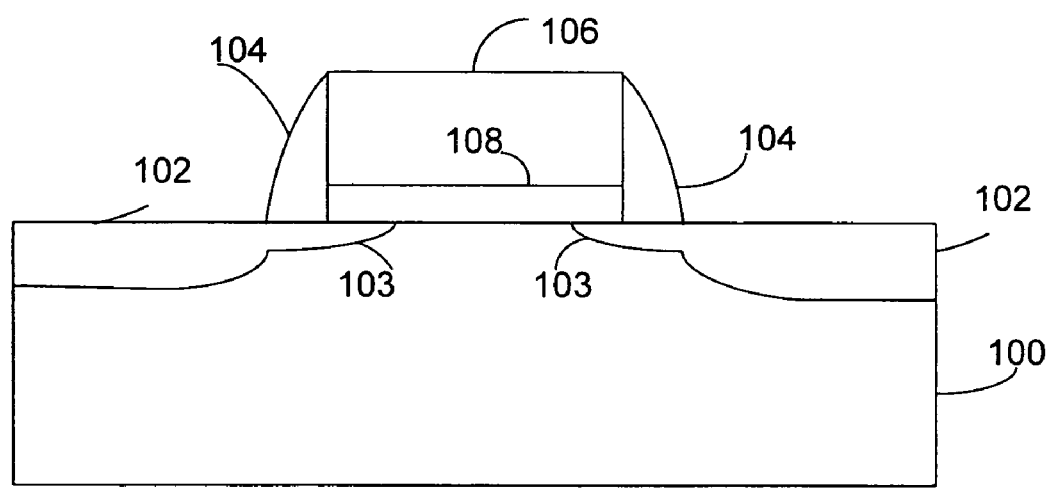
FIGS. 1a-1j represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming source/drain regions in a substrate, amorphizing the source/drain regions, annealing the source/drain regions at a first temperature, and then annealing the source drain regions at a second temperature, wherein the first temperature is lower than the second temperature. Methods of the present invention enable the fabrication of microelectronic devices, such as, for example, transistor structures, wherein annealing the source/drain regions at a lower temperature prior to a higher temperature anneal enables the dissolution of defects that may generate leakage pathways, thus decreasing junction leakage in the device.

FIGS. 1a-1j illustrate an embodiment of a method of forming a microelectronic structure, such as a transistor structure, for example. FIG. 1a illustrates a cross-section of a portion of a substrate 100. The substrate 100 may be comprised of materials such as, but not limited to, silicon, silicon-on-insulator, germanium, indium antimonide, lead telluride, indium arsenide, indium phosphide, gallium arsenide, gallium antimonide, or combinations thereof. In one embodiment, the substrate 100 may include various devices (not shown) that, together, form a microprocessor. In an embodiment, the substrate 100 may include devices that together form multiple microprocessor cores on a single die.

In one embodiment, the substrate 100 may further comprise a gate material 106 disposed on a gate dielectric 108, sidewall spacers 104 disposed adjacent sidewalls of the gate material 106 and gate dielectric 108, and source/drain regions 102 and extension regions (tips) 103 formed on/in the substrate 100. In one embodiment, the tips 103 can be formed using a conventional implant process prior to the spacer 104 formation and the source/drain regions 102 can be formed using a conventional implant process after the spacer 104 formation.

Figure 1B:
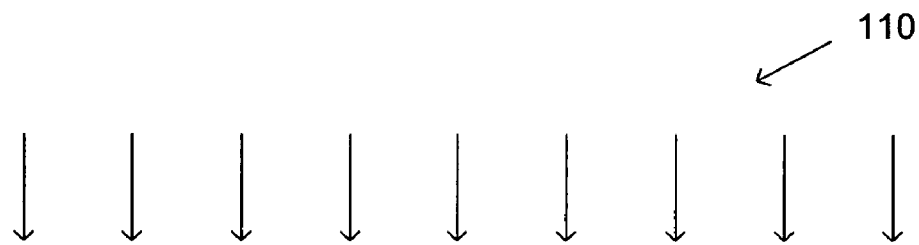
Figure 1B:
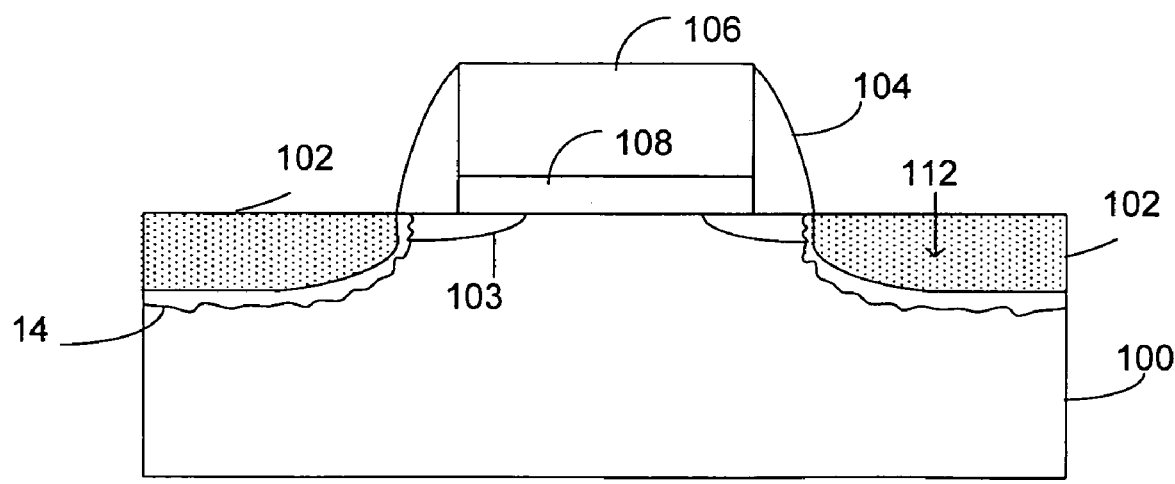

An ion implant process 110 may be performed on/in the source/drain regions 102 (FIG. 1b). In one embodiment, ion species such as, but not limited to germanium, nitrogen, silicon, argon, or the like may be implanted in order to amorphize the crystalline source/drain 102 and tip 103 regions in the substrate 100. In one embodiment, the ion species may be electrically neutral. Here, an amorphized region 112 is indicated by the dot-pattern shading on/in source/drain regions 102.

In one embodiment, the implant process 110 may form the amorphized region 112. In one embodiment, the amorphized region 110 may be deeper than an electrical junction (source/drain junction, for example), and may comprise an ion species that is identical to the substrate, such as silicon, in the case of a silicon substrate, for example. In some embodiments, amorphization can reduce the density of defects, such as pipe defects, for example, that may appear subsequent to other processes that may be performed. These processes may include the formation of reactive metal silicides (such as nickel silicide and cobalt silicide) on/in the source drain regions 102, for example.

The method of re-growth (re-crystallization) of the amorphous region 112 can increase external resistance and junction leakage in the microelectronic device through the creation of defects, such as pipe defects, for example. In one embodiment, the bulk amorphous region 112 may be relatively free of defects due to the nature of the recrystalization process. In some embodiments the defects that may be present at an interface 114 and beyond (end of range damage) may cause problems with the device, such as from interactions between various dopant species (such as but not limited to the ion implant species and/or electrically active dopant species) and the defects.

These defects may be related to the interaction of the dopant and the end of range damage at the interface 114 and beyond. In some cases, the dissolution of such defects may follow a different mechanism than the re-crystallization process. For example, in an ideal re-crystallization process, the amorphous region 112 may remain relatively untouched during re-crystallization while substantially all defects may be removed at the interface 114 and beyond prior to a conventional junction anneal process. If this could be accomplished, the junction leakage would be reduced, thereby reducing the power consumption of a microelectronic device. In one embodiment, this would be reflected in an improvement of the maximum frequency for a fixed power consumption of the device.

In one embodiment, end of range defects that may be located beyond the amorphous region 112 can result in the deactivation of counter-doping implants known as halo or threshold voltage implants. These are low dose implants of the opposite doping type as the doping type of the tips/source drain extension, and may be used to control leakage. Deactivation of these type of dopants may require a larger implant dose to achieve the same electrical characteristics. These deactivated dopants can degrade mobility and increase junction leakage. In some instances, the spatial dependence of this deactivation cannot be simply compensated only by a dose increase. The defects may not be completely annealed out during subsequent conventional thermal processing, and can result in mobility degradation and increased transistor leakage.

In some embodiments, the interface 114 that may be created after the implant process 110 may be rough, and additionally, end of range damage may be present beyond the interface 114. The interface 114 may be disposed between the amorphized region 112 of the source/drain regions 102 and a crystalline silicon region of the substrate 100. The interface 114 may also be disposed adjacent to the spacer 104 (it may be underneath the spacer 104, in some embodiments) and adjacent to the tips 103.

Figure 1C:
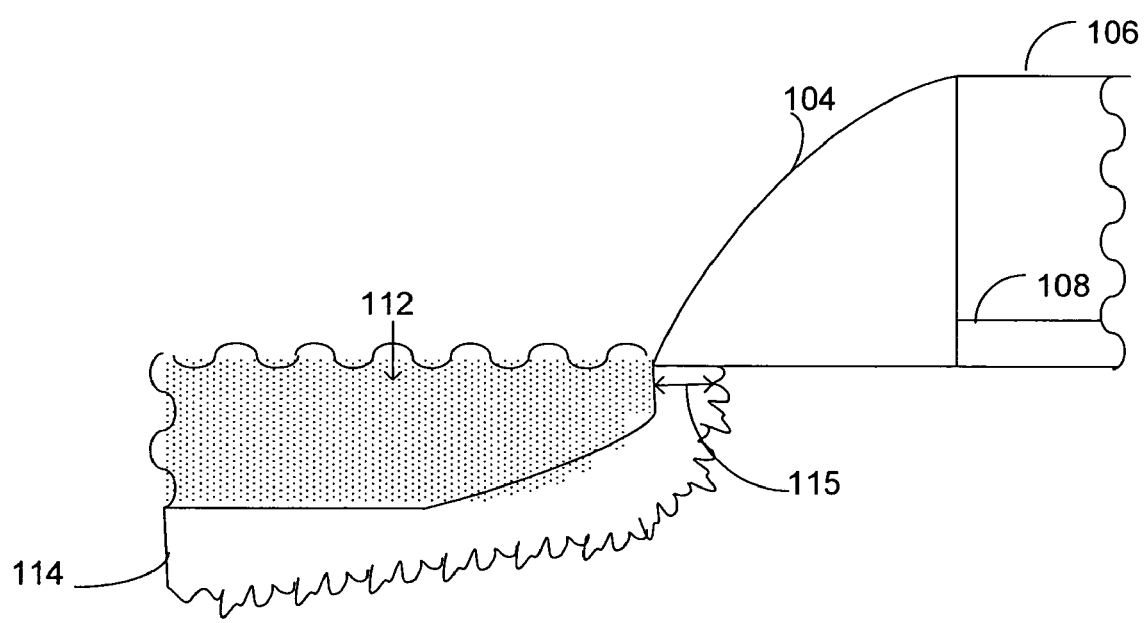

The damage that may occur subsequent to the implantation process 110 may create various defects within the interface 114. Referring to FIG. 1c, a closer view of the interface 114 reveals a thickness 115 of the interface 114. In one embodiment, the thickness 115 of the interface may comprise greater than about 8 nm. It will be understood by those in the art that the thickness 115 of the interface 114 may vary depending upon the particular process parameters. In one embodiment, the interface 114 may be substantially amorphous.

Figure 1D:
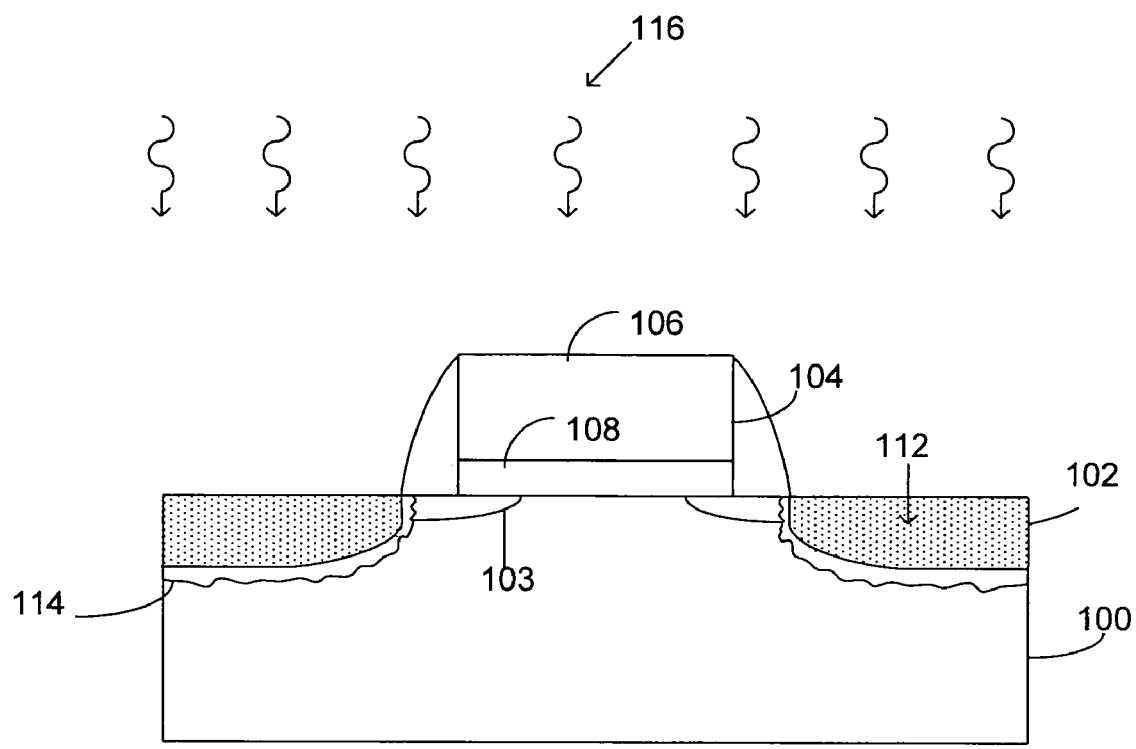

A first anneal 116 may be performed at a first temperature, in which the interface 114 may become partially re-grown, i.e., recrystallization of a portion of the interface 114 may occur (FIG. 1d). This recrystallization may produce an improved interface 114. The first anneal 116 may bring the interface 114 to a peak temperature using a rapid temperature jump process, such as an ultra-fast anneal process, for example. In some embodiments, a flash lamp or laser annealing process may be utilized, by illustration and not limitation.

In one embodiment, such a process may comprise a first temperature in a range of about 500 to about 1300 degrees Celsius, and a time of less than about 1 second. In some embodiments, the time may be significantly less than 1 second (for example between about 0.1 to 15 milliseconds). In another embodiment, the temperature of the first anneal 116 may comprise between about 850 degrees Celsius to about 950 degrees Celsius.

Figure 1E:
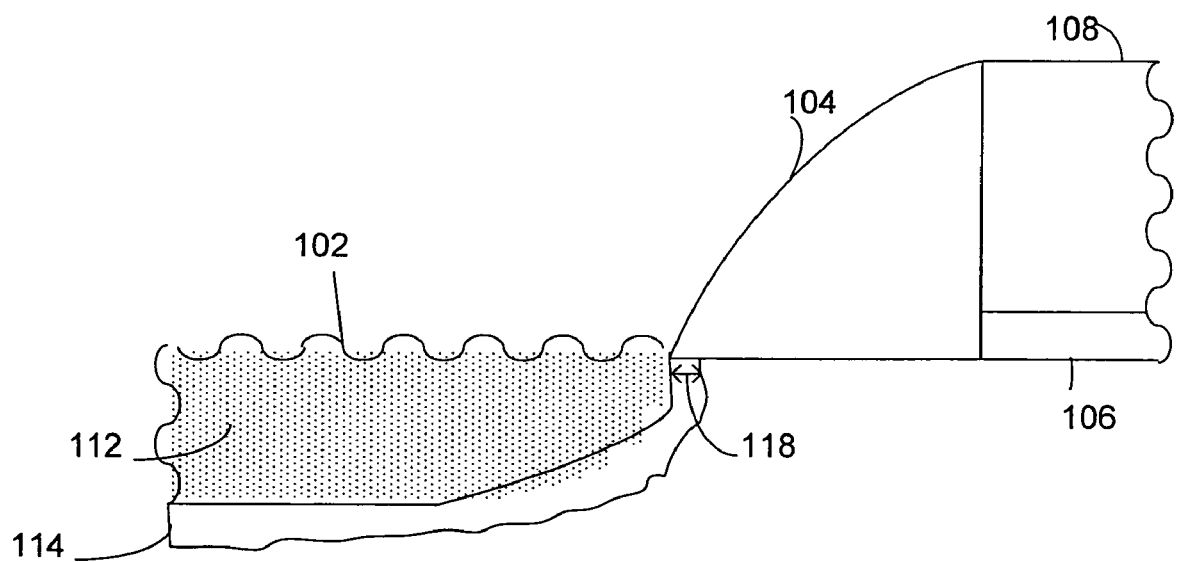

In one embodiment, the interface 114 may comprise a reduced thickness 118 after the first anneal 116 is performed (FIG. 1e). In one embodiment, the reduced thickness 118 of the interface 114 may comprise a thickness that is reduced by about 20 percent or more as compared with the thickness 115 of the interface 114 present before the first anneal process 116 (FIG. 1c).

In some embodiments, the damage that may be present after the implantation process 110 may create a rough interface 114 that may comprise defects that do not completely dissolve following the first anneal 116. In one embodiment, annealing the source/drain regions 102 at a first temperature may reduce defects without completely re-crystallizing the amorphous region 112. In one embodiment, the amorphous region 112 may be deeper than a subsequent implant of dopant species. In one embodiment, a second ion implant 111 of dopant may occur after the first implant 116/anneal 110 sequence (FIG. 1j). In one embodiment, an electrically active dopant may be ion implanted by the second implant 111 to a depth 113 that may be shallower than a depth 117 of the partially recrystalized source/drain region 102.

Figure 1F:
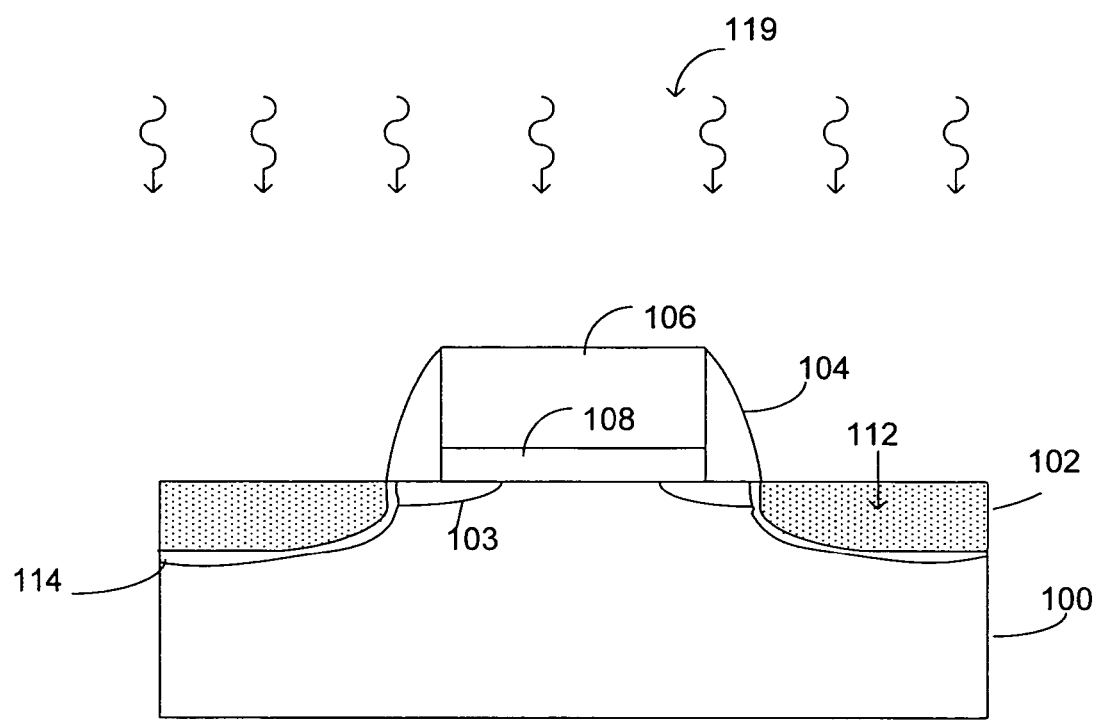

In one embodiment, a second anneal 119 may be applied in the millisecond or second time frame, depending upon the particular application, that may allow substantial to complete re-crystalization of the amorphous layer 112 and may further remove defects, such as from within the interface 114, within the source/drain regions 102 and from surrounding regions (FIG. 1f). In one embodiment, the second anneal 119 may be performed at a second temperature that is higher than the first anneal 116 temperature.

In one embodiment, the second temperature may comprise between about 500 to about 1300 degrees Celsius, and a time of less than about 1 second. In some embodiments, the time may be significantly less than 1 second (for example between about 0.1 to 15 milliseconds). In another embodiment, the second temperature of the second anneal 119 may comprise between about 950 degrees Celsius to about 1050 degrees Celsius.

Figure 1G:
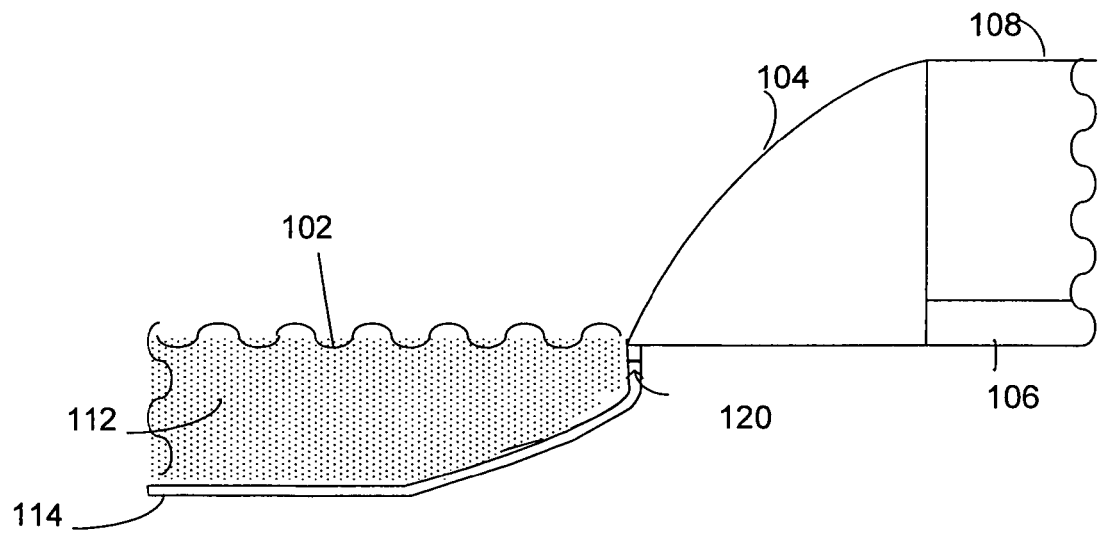
Figure 1H:
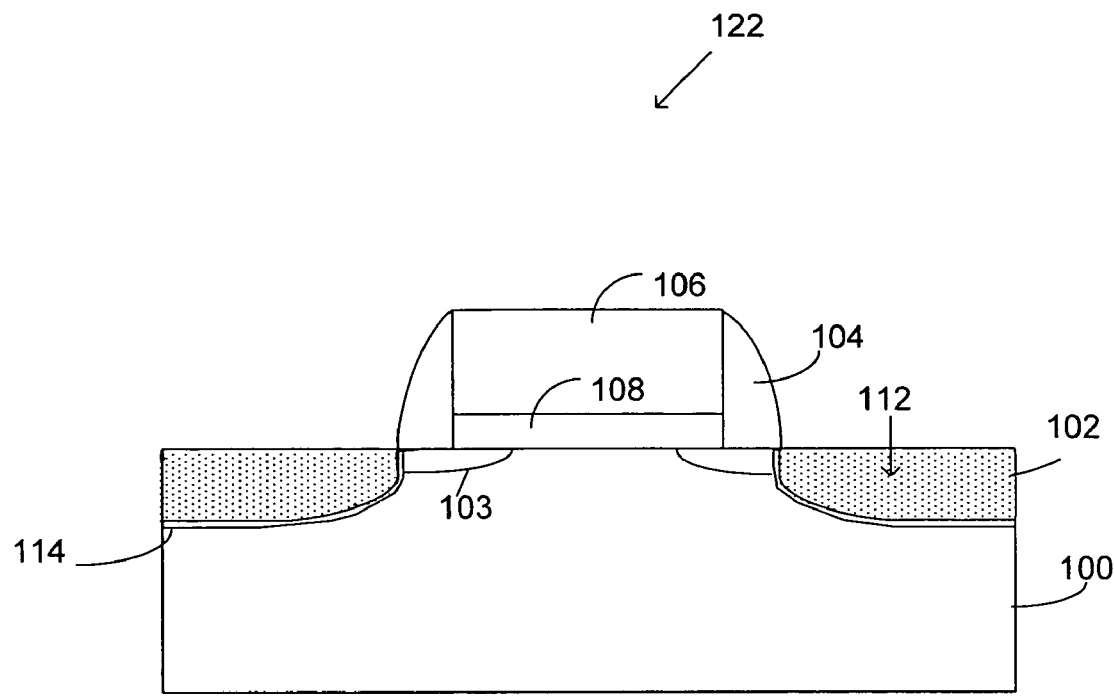

In one embodiment, the interface 114 may comprise a further reduced thickness 120 after the second anneal 116 is performed (FIG. 1g). In one embodiment, the reduced thickness 120 of the interface 114 may comprise a thickness that is reduced by about 20 percent or more as compared with the second thickness 115 of the interface 114 present before the first anneal process 116. In some embodiments, the application of the first anneal 116 and the second anneal 119 together may reduce the thickness (via recrystallization) of the interface 114 by up to about 50 percent or greater, from the pre-anneal interface 114 thickness (FIG. 1c), depending upon the particular application.

By applying the first anneal 116 and the second anneal 119, a transistor structure 122 may be formed comprising an improved interface 114 (FIG. 1h) and lower defects at the interface. In one embodiment, the interface 114 may comprise a recrystallized region and/or interface. The recrystallized region/interface may be a portion and/or may comprise substantially all of the interface 114, and an amorphous interface portion may be adjacent to the recrystallized portion. In one embodiment, following the second anneal 119, most if not all of the amorphous region 112 may be re-crystallized.

Figure 1I:
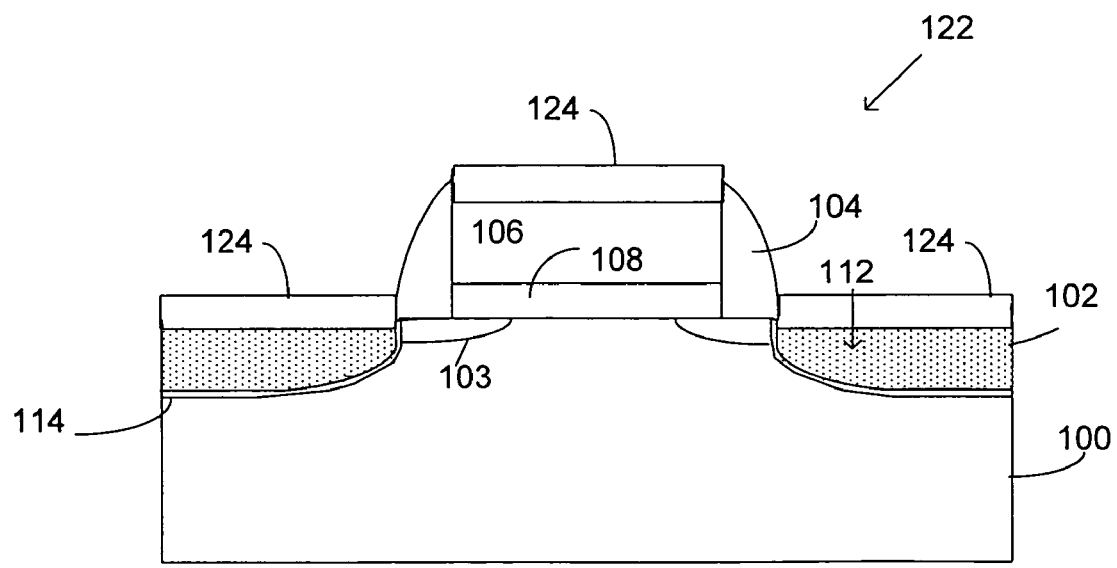
Figure 1J:
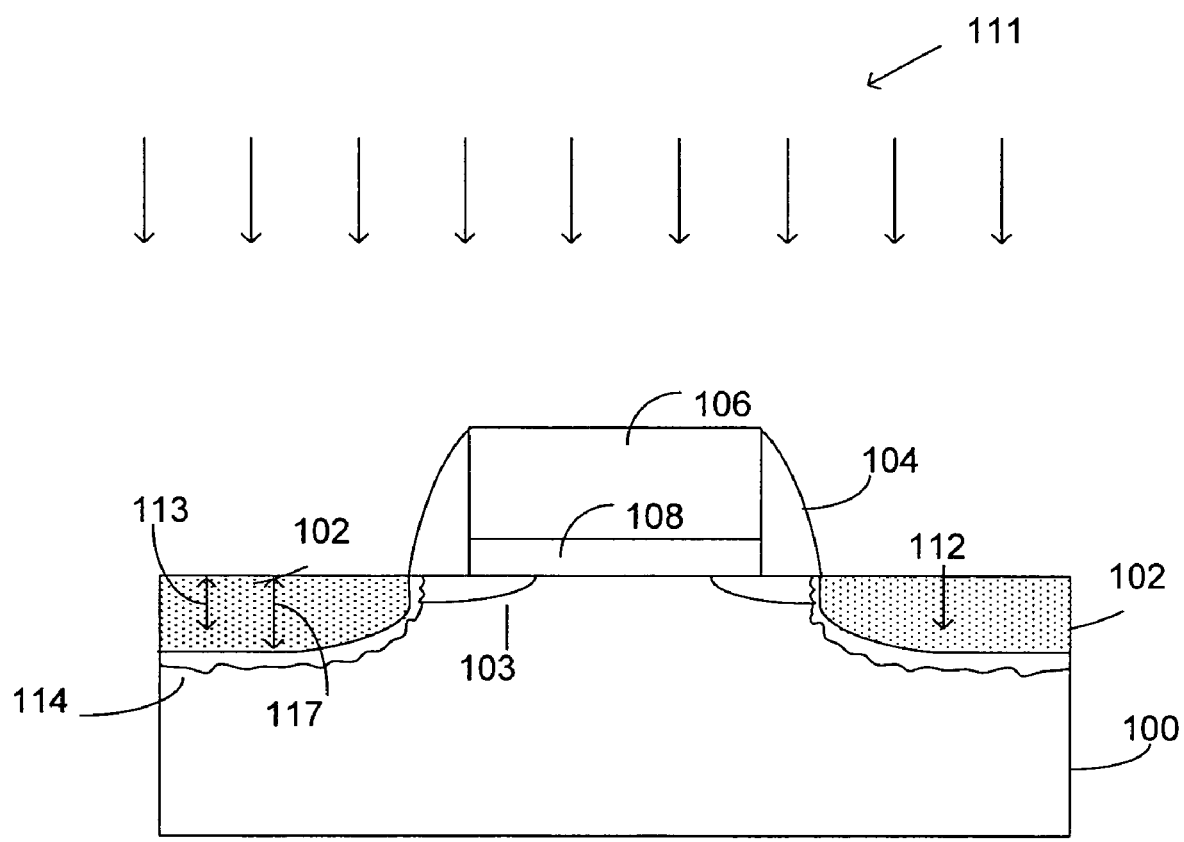

The transistor structure 122 may undergo further processing, such as forming salicide regions 124 in/on the gate 106 and source/drain regions 102, as is known in the art (FIG. 1i). In one embodiment, the salicide regions 124 can be formed using conventional processing, whereby a metal (such as titanium, tantalum, platinum, molybdenum, cobalt, nickel or the like) is deposited over the transistor structure 122, and then reacted with the exposed silicon areas of the source/drain regions 102 and gate 106 to form a silicide. In one embodiment, the silicide formation may also re-crystallize a portion and/or substantially all of the amorphized source/drain regions 102.

Application of an intermediate temperature anneal in a millisecond time frame enables partial regrowth of the interface 114. This partial re-growth serves to remove defects that may not be completely dissolved by the application of a single high temperature junction anneal step. In addition, insertion of a rapid anneal process that separates an amorphization process and the implant of electrically active dopants may remove interaction of electrically active dopants with the interface 114 where they may getter.

For the first anneal 116, there may be an optimum time/process conditions that may minimize re-crystallization while maximizing the temperature to remove point defects at the junction interface and below. To the extent that these defects may extend between adjacent source and drain regions and/or intersect with each, source-to-drain leakage paths can be produced. These paths can compromise a microelectronic device's yield, performance, and/or reliability.

Following the second, higher temperature anneal 119, the improved interface 114 enables the formation of a junction that exhibits lower leakage, which can translate into lower chip power consumption, for example. In one embodiment, the process parameters for the first anneal 116 and the second anneal 119 may be optimized to allow for a minimal amount of recrystallization of the amorphous interface 114 while still being hot enough to anneal out a substantial amount of defects and reactivating dopants.

The annealing process of the various embodiments may recrystallize portions of the source/drain regions for the first anneal 102 and thereby preferentially reactivates dopants adjacent the source/drain 102 and tip region 103 (i.e., the interface 114). This provides a means for modulating the amount/degree of silicon amorphization along the active area's peripheral boundaries and varying encroachment of the amorphous regions. This has a corresponding effect on reducing the external resistance and leakage associated with the tip-to-channel resistance.

The degree of recrystallization can vary according to the particular application, depending on the specifics of the actual process. In some embodiments, silicon regions may be recrystallized only to the extent that the amorphized regions still reliably prevent the formation of defects, such as pipe defects, for example. The time/temperature profile may be optimized for the first anneal 116 to provide the right balance between remaining amoprhous layer and the reduction in end of range damage.

Rapid high temperature annealing in the sub second domain for the first anneal 116 may also advantageously reduce the density of otherwise un-repairable interface and end of range defects. In addition, annealing can reduce the interface roughness which would reduce the density of defects that can have unfavorable interactions with the electrically active dopants, for example.

Figure 3:
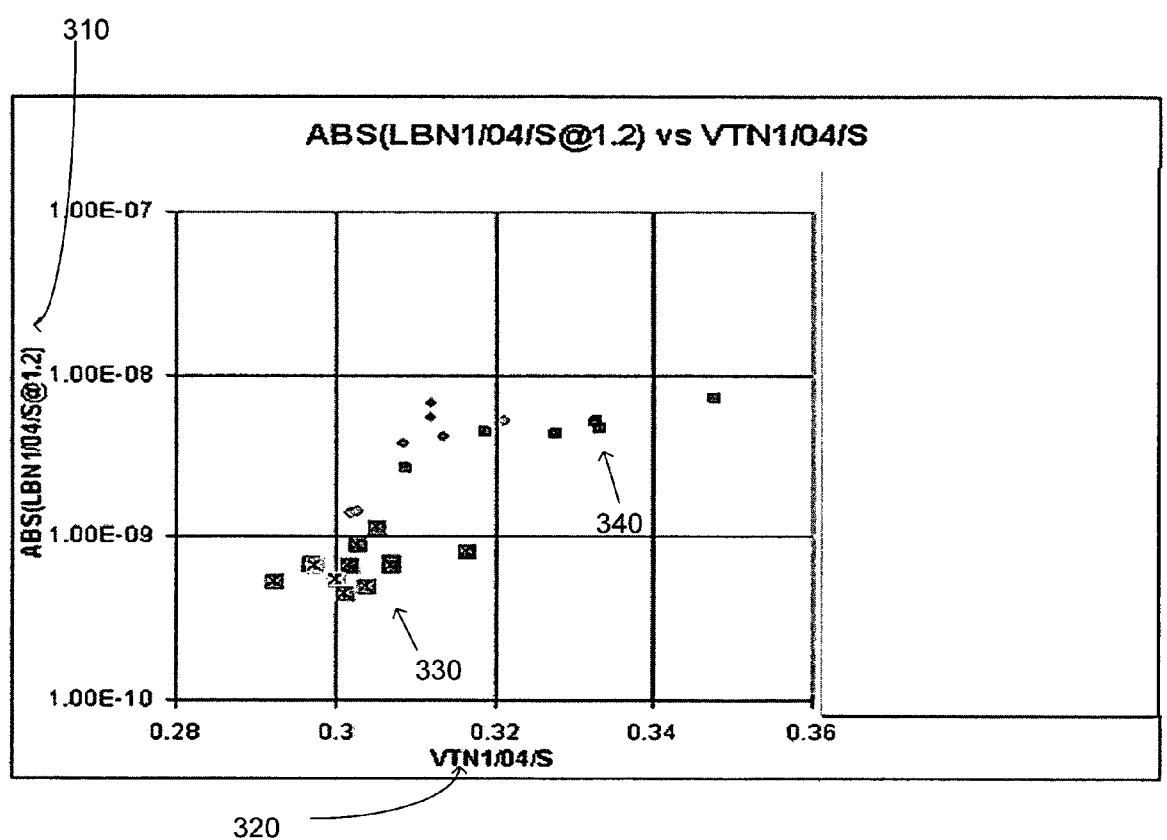
FIG. 3 represents a graph according to an embodiment of the present invention.

Thus, the benefits of the embodiments of the present invention include, but are not limited to, reducing the interface 114 roughness, dissolving defects that may generate junction leakage pathways, and reduction in overall junction leakage. In one embodiment, for the same threshold voltage, devices utilizing the first anneal followed by the second higher temperature anneal as in the various embodiments of the present invention, exhibit a five to ten times improvement in junction leakage as shown in FIG. 3. FIG. 3 depicts junction leakage 310 vs. threshold voltage 320 for devices 340 (squares) which received both anneals according to embodiments of the present invention as compared with devices 330 that did not receive such processing.

Figure 2:
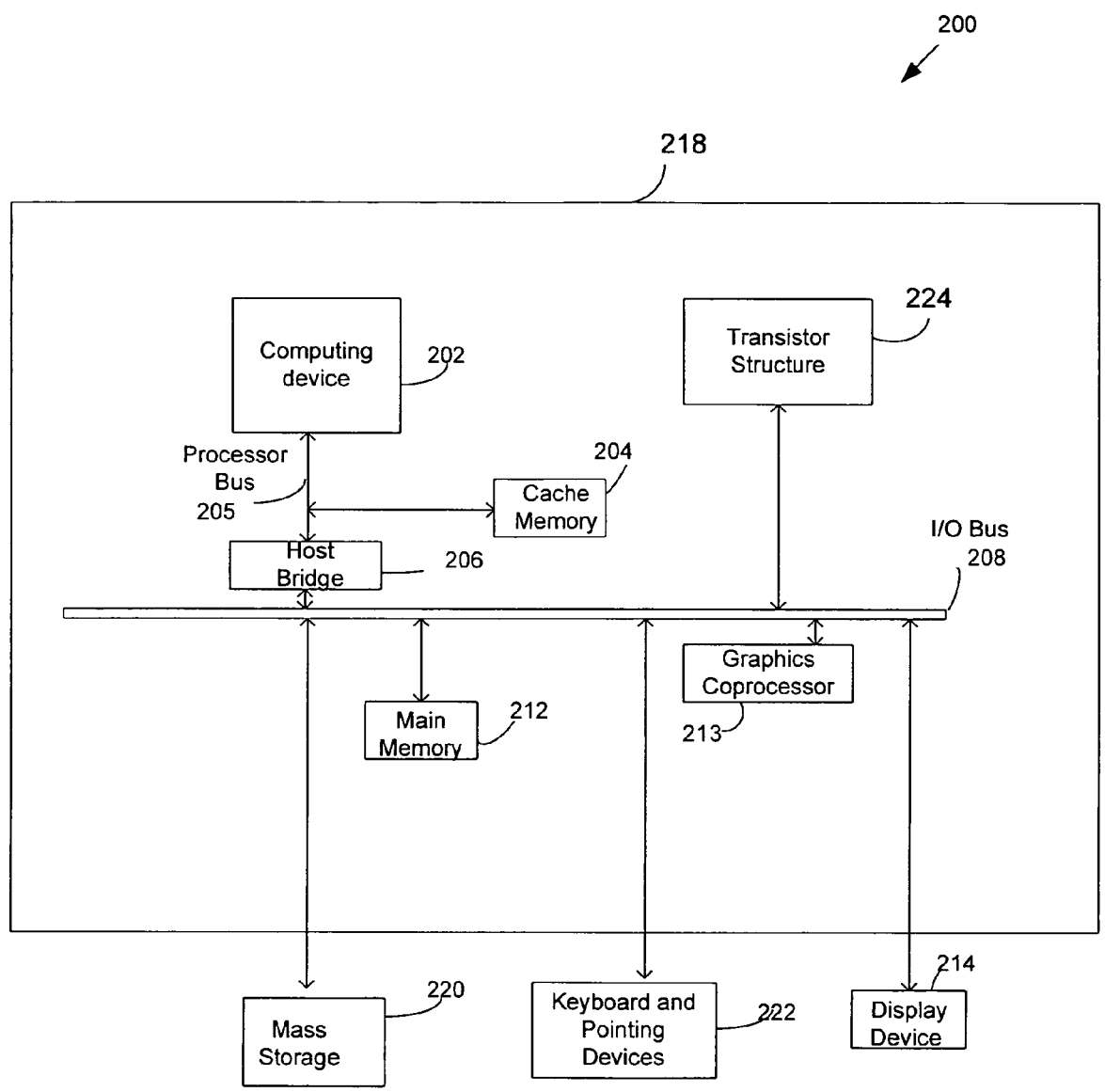
FIG. 2 represents a system according to an embodiment of the present invention.

FIG. 2 is a diagram illustrating an exemplary system 200 capable of being operated with methods for fabricating a microelectronic structure, such as the transistor structure of FIG. 1i, for example. It will be understood that the present embodiment is but one of many possible systems in which the transistor structures of the present invention may be used.

In the system 200, a transistor structure 224 may be communicatively coupled to a printed circuit board (PCB) 218 by way of an I/O bus 208. The communicative coupling of the transistor structure 224 may be established by physical means, such as through the use of a package and/or a socket connection to mount the transistor structure 224 to the PCB 218 (for example by the use of a chip package, interposer and/or a land grid array socket). The transistor structure 224 may also be communicatively coupled to the PCB 218 through various wireless means (for example, without the use of a physical connection to the PCB), for example.

The system 200 may include a computing device 202, such as a processor, and a cache memory 204 communicatively coupled to each other through a processor bus 205. The processor bus 205 and the I/O bus 208 may be bridged by a host bridge 206. Communicatively coupled to the I/O bus 208 and also to the transistor structure 224 may be a main memory 212. Examples of the main memory 212 may include, but are not limited to, static random access memory (SRAM) and/or dynamic random access memory (DRAM), and/or some other state preserving mediums. The system 200 may also include a graphics coprocessor 213, however incorporation of the graphics coprocessor 213 into the system 200 is not necessary to the operation of the system 200. Coupled to the I/O bus 208 may also, for example, be a display device 214, a mass storage device 220, and keyboard and pointing devices 222.

These elements perform their conventional functions well known in the art. In particular, mass storage 220 may be used to provide long-term storage for the executable instructions for a method for forming transistor structures in accordance with embodiments of the present invention, whereas main memory 212 may be used to store on a shorter term basis the executable instructions of a method for forming transistor structures in accordance with embodiments of the present invention during execution by computing device 202. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 212 may supply the computing device 402 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic devices are well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method of forming a device comprising:
   amorphizing source/drain regions in a substrate by implanting the source/drain regions with an electrically neutral ion species, wherein the electrically neutral species comprises an ion species that is identical to the substrate, and wherein a depth of an amorphized region that is formed is deeper than a depth of the source drain region;

annealing the source/drain regions at a first temperature; and annealing the source drain regions at a second temperature, wherein annealing comprises annealing by utilizing a rapid thermal annealing process wherein the rapid thermal annealing process comprises a duration of time of less than about one second, wherein the first temperature is lower than the second temperature.

2. The method of claim 1 further comprising wherein the first temperature comprises between about 850 degrees Celsius to about 950 degrees Celsius.

3. The method of claim 1 further comprising wherein the second temperature comprises between about 700 degrees Celsius to about 1050 degrees Celsius.

4. The method of claim 1 wherein the duration of time comprises about 0.1 milliseconds to about 15 milliseconds.

5. The method of claim 1 further comprising recrystallizing a portion of an interface region.

6. The method of claim 5 wherein the portion comprises a portion adjacent to the source/drain regions and a spacer.

7. The method of claim 5 wherein re-crystallizing a portion comprises reducing a thickness of the interface region by up to about 50 percent.

8. The method of claim 5 wherein annealing the source/drain regions at a first temperature further comprises subsequently ion implanting an electrically active dopant to a depth that is shallower than a depth of a partially re-crystallized source/drain region.

* * * * *